United States Patent
Dreps et al.

(10) Patent No.: US 7,279,949 B2
(45) Date of Patent: Oct. 9, 2007

(54) PROGRAMMABLE DELAY ELEMENT

(75) Inventors: Daniel M. Dreps, Georgetown, TX (US); Frank D. Ferraiolo, New Windsor, NY (US); Daniel J. Friedman, Sleepy Hollow, NY (US); Seongwon Kim, Old Tappan, NJ (US); Hector Saenz, Round Rock, TX (US); Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 11/215,416

(22) Filed: Aug. 30, 2005

(65) Prior Publication Data

US 2006/0181324 A1    Aug. 17, 2006

Related U.S. Application Data

(60) Provisional application No. 60/652,381, filed on Feb. 11, 2005.

(51) Int. Cl.
*H03H 11/26*    (2006.01)
(52) U.S. Cl. ............................... 327/276; 327/281
(58) Field of Classification Search ................ 327/278, 327/276, 281
See application file for complete search history.

(56) References Cited

U.S. PATENT DOCUMENTS

| | | | |
|---|---|---|---|
| 4,684,880 A | 8/1987 | Chan | |
| 5,374,860 A | 12/1994 | Llewellyn | |
| 5,543,745 A * | 8/1996 | Notani | ........................ 327/538 |
| 5,557,194 A | 9/1996 | Kato | |
| 5,670,904 A | 9/1997 | Moloney et al. | |
| 5,731,727 A * | 3/1998 | Iwamoto et al. | ............ 327/281 |
| 6,014,050 A | 1/2000 | McClure | |
| 6,144,786 A | 11/2000 | Chethik | |
| 6,255,879 B1 | 7/2001 | Voss | |
| 6,285,229 B1 | 9/2001 | Chu et al. | |
| 6,400,735 B1 | 6/2002 | Percey | |
| 6,411,149 B1 * | 6/2002 | Ooishi | ........................ 327/281 |
| 6,421,784 B1 | 7/2002 | Chu et al. | |
| 6,546,530 B1 | 4/2003 | Dreps et al. | |
| 6,611,936 B2 | 8/2003 | Jue et al. | |
| 6,686,795 B2 | 2/2004 | Hisano | |
| 6,697,283 B2 | 2/2004 | Marotta et al. | |
| 6,708,238 B1 | 3/2004 | Rotker | |

* cited by examiner

*Primary Examiner*—Kenneth B. Wells
*Assistant Examiner*—Ryan C. Jager
(74) *Attorney, Agent, or Firm*—Anne V. Dougherty; Ryan, Mason & Lewis, LLP

(57) ABSTRACT

Delay elements and delay lines having glitchless operation are disclosed. By way of example, apparatus for delaying an input signal comprises a reference current generator for generating a constant current, wherein the constant current is insensitive to a variation of a power supply voltage, at least one variable bias voltage generator coupled to the reference current generator for generating a set of bias voltages based on the constant current generated by the reference current generator and a digitally programmable delay control input, and at least one delay element coupled to the at least one variable bias voltage generator for delaying the input signal by a constant delay which is determined by the set of bias voltages generated by the at least one variable bias voltage generator.

14 Claims, 3 Drawing Sheets

PROGRAMMABLE DELAY ELEMENT

The present application claims the priority of the U.S. provisional application identified as Ser. No. 60/652,381, filed Feb. 11, 2005, and entitled "Glitchless Programmable Delay Element," the disclosure of which is incorporated by reference herein.

FIELD OF THE INVENTION

The present invention generally relates to computer systems and, more particularly, to programmable delay elements for use in computer systems.

BACKGROUND OF THE INVENTION

As the operation speed of computer systems continues to increase, the need exists to delay either clock or data signals to optimize the critical timing within the computer system due to the timing requirements of system components. Also as the clock rate in the system increases, the timing between the computer elements and within the computer chips becomes critical.

However, a delay line used in these systems should have "noise free" operation, which can be affected by two key characteristics: (1) delay programming; and (2) power supply noise in delay generation. The conventional method of using logic gates as delay elements and using multiplexers to switch between these elements suffers from glitch and delay variation due to power supply noise.

FIG. 1 illustrates a conventional way of building a programmable delay line using a multiplexer. As shown in delay line architecture 100, an input signal A is passed through serial delay elements 102-1, 102-2, and 102-3. The original input signal and the outputs of the three delay elements serve as inputs to multiplexer 104. Signal S is used to select which one of the original signal and the outputs of the three delay elements serves as output signal Z.

However, since multiplexers are not normally glitch free when they selectively switch from one input to the other, the output of the delay scheme will have a glitch added to the output signal.

The constant unit delay is an important consideration particularly when deskewing data, since any variation in delay decreases overall performance. Conventional delay circuits with logic gate unit delays are typically varied by power supply noise.

FIG. 2 shows a conventional delay element using an inverter structure. That is, the delay element in FIG. 2 can serve as one or more of the delay elements (102-1, 102-2, 102-3) in architecture 100 of FIG. 1. As is well known in signal processing art, complementary field effect transistors (FETs) T1 and T2 serve as a first inverting stage, and complementary FETs T3 and T4 serve as a second inverting stage. Also, as per convention, a FET with a circle on the gate terminal is known to be a positive-type FET or pFET, while a FET without a circle on the gate terminal is a negative-type FET or nFET. Also, typical conventions regarding source and drain terminals are employed here.

Typically, the time it takes for input signal A to propagate through the two inverting stages and appear as output signal Z is considered the delay attributable to the delay element.

The following U.S. patents illustrate limitations of conventional "noise free" operation in programmable delay lines: U.S. Pat. No. 6,421,784; U.S. Pat. No. 6,285,229; U.S. Pat. No. 6,546,530; U.S. Pat. No. 6,708,238; U.S. Pat. No. 5,374,860; U.S. Pat. No. 5,670,904; U.S. Pat. No. 6,611,936; U.S. Pat. No. 6,255,879; U.S. Pat. No. 6,014,050; U.S. Pat. No. 6,144,786 and U.S. Pat. No. 6,400,735.

Nonetheless, a need exists for a delay element for computer systems that has glitchless operation, which overcomes the above and other drawbacks, as well as improving over conventional glitchless delay line approaches.

SUMMARY OF THE INVENTION

Principles of the invention provide delay elements and delay lines that have glitchless operation.

By way of example, in one aspect of the invention, apparatus for delaying an input signal comprises a reference current generator for generating a constant current, wherein the constant current is insensitive to a variation of a power supply voltage, at least one variable bias voltage generator coupled to the reference current generator for generating a set of bias voltages based on the constant current generated by the reference current generator and a digitally programmable delay control input, and at least one delay element coupled to the at least one variable bias voltage generator for delaying the input signal by a constant delay which is determined by the set of bias voltages generated by the at least one variable bias voltage generator.

The apparatus may further comprise a second variable bias voltage generator coupled to the reference current generator for generating a second set of bias voltages based on the constant current generated by the reference current generator and a second digitally programmable delay control input, and a second delay element coupled to the second variable bias voltage generator and the at least one delay element for delaying the input signal by a constant delay which is determined by the second set of bias voltages generated by the second variable bias voltage generator.

The apparatus may also still further comprise a third delay element coupled to the second variable bias voltage generator and the second delay element for delaying the input signal by a constant delay which is determined by the second set of bias voltages generated by the second variable bias voltage generator.

The at least one delay element, the second delay element, and the third delay element may be coupled in a binary weighted manner so as to provide four delay steps using the two digitally programmable delay control inputs.

A variable bias voltage generator may comprise at least one current mirror, responsive to the digitally programmable control delay input, for controlling the amount of current used to generate the set of bias voltages. The variable bias voltage generator may also comprise at least one low voltage threshold transistor which shares a gate voltage with transistors comprising the at least one current mirror.

A delay element may comprise one or more transistors that are current limited based on the set of bias voltages generated by the variable bias voltage generator thereby causing the constant delay produced by the at least one delay element to be insensitive to a variation of a power supply voltage.

In another aspect of the invention, a method for delaying an input signal comprises generating a constant current, wherein the constant current is insensitive to a variation of a power supply voltage, generating a set of bias voltages based on the constant current and a digitally programmable delay control input, and delaying the input signal by a constant delay determined by the set of bias voltages. The method may further comprise generating a second set of bias voltages based on the constant current and a second digitally programmable delay control input, and delaying the input signal by a constant delay which is determined by the second set of bias voltages.

In a further aspect of the invention, apparatus for delaying an input signal comprises at least one delay element responsive to a set of bias voltages that are generated based on a constant current and a digitally programmable delay control input, wherein the constant current is insensitive to a variation of a power supply voltage, the at least one delay element delaying the input signal by a constant delay which is determined by the set of bias voltages.

Advantageously, since the one or more delay elements are controlled by bias voltages which are not directly in the delay signal path, there is no glitch at the output of the delay line when switching between different delay steps. Second, by way of further example, when the delay is set, a delay element shows constant unit delay against any VDD variation.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention may be illustratively described herein in the context of high performance computer systems. However, it is to be understood that the invention is not limited to use in any particular application, but rather may be used in any application in which it would be desirable to have a glitch free delay element.

Also, while the circuitry described herein in accordance with principles of the invention may be suitable for implementation with metal oxide semiconductor field effect transistor (MOSFET) technology, the invention is not limited to any particular implementation technology.

Further, a "glitch" is generally meant to refer to some undesired state of uncertainty or randomness in the output signal. For example, a glitch can occur when the inputs of a circuit change, and the outputs change to some random value for some very brief time before they settle down to the correct value. If another circuit inspects the output at just the wrong time, reading the random value, the results can be very wrong and very hard to debug. However, it is to be understood that principles of the invention are not intended to be limited to any particular definition of a glitch.

As will be described below, an illustrative embodiment of a programmable delay line of the invention comprises an analog reference generator with impedance controlled delay elements to increase power supply voltage insensitivity. The analog reference current generator (RCG) produces a constant current to be used as reference for the VBVG. The delay element uses the reference voltage created by the VBVG to produce a constant unit delay. The unit delay is insensitive to power supply noise. The delay line is formed by cascading delay elements, where the bias voltage for each element can be switched to a different value to make the delay line programmable. By switching the current within the VBVG rather than in the delay element, the delay line can achieve glitchless delay variation.

Figure 1:
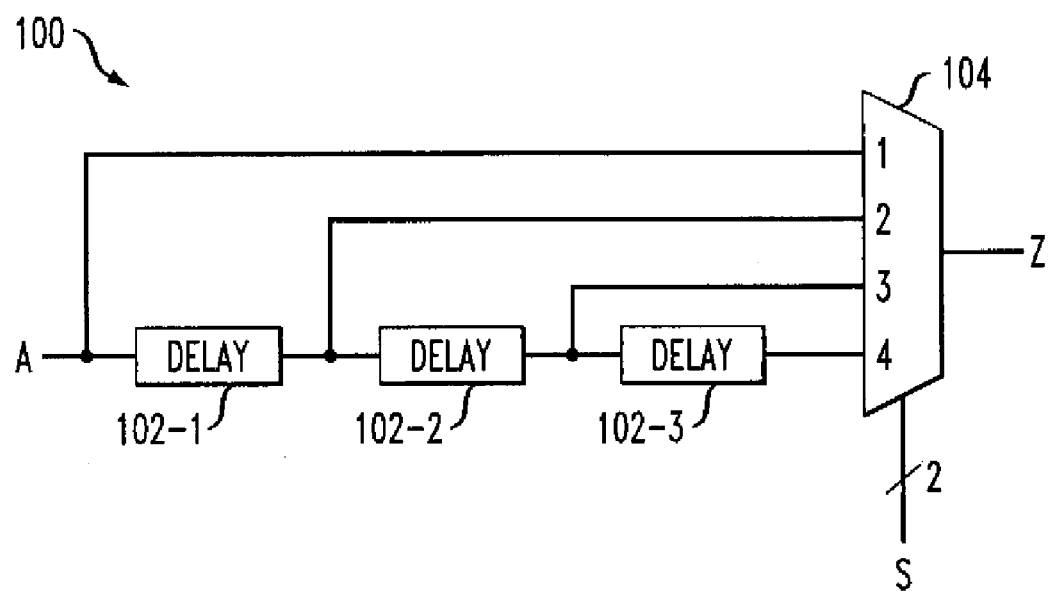
FIG. 1 illustrates a block diagram of a conventional programmable delay line using a multiplexer to select different amount of delay.
Figure 2:
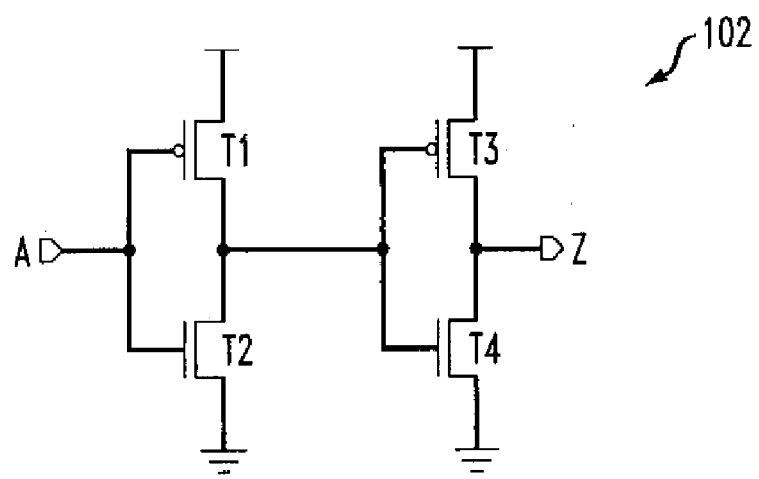
FIG. 2 illustrates a circuit diagram of a conventional delay element.
Figure 3:
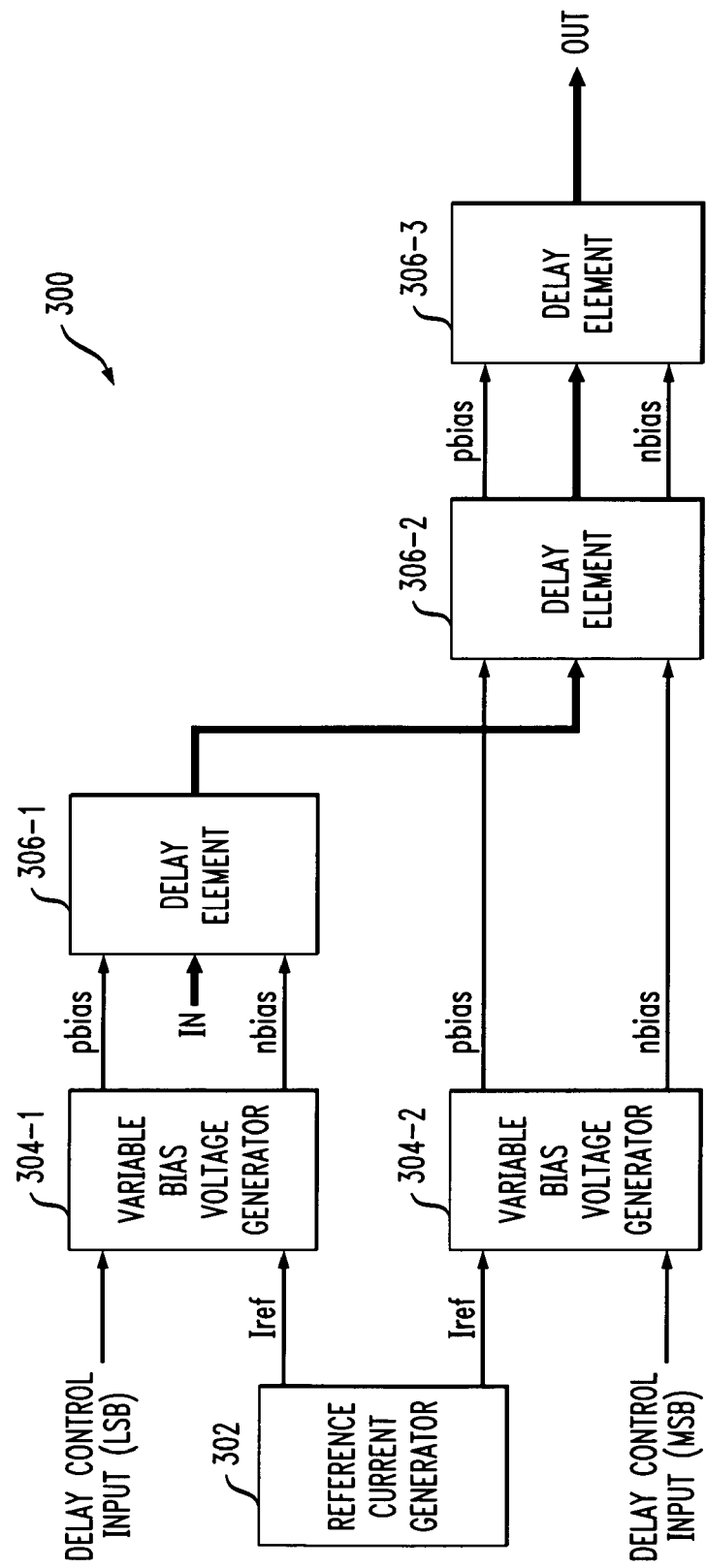
FIG. 3 illustrates a block diagram of a delay line, according to an embodiment of the present invention.

Referring now to FIG. 3, a delay line architecture, according to an embodiment of the present invention, is shown. As shown, delay line architecture 300 comprises functional blocks for delaying an input signal ("in") so as to yield an output signal ("out"). Architecture 300 comprises a reference current generator (RCG) 302, a first variable bias voltage generator (VBVG) 304-1, a second variable bias voltage generator (VBVG) 304-2, and delay elements (DE) 306-1, 306-2, and 306-3.

It is to be understood that more or less VBVGs and DEs may be employed depending on the particular application in which the delay line is to be employed. That is, in one alternative embodiment of the invention, a delay line may be implemented with RCG 302, VBVG 304-1 and DE 306-1, controlled by one delay control input bit. Also, it is to be understood that while separate VBVG functional blocks and separate DE blocks are illustrated, this is for illustrative purposes only. That is, circuitry or other processing mechanisms used to implement the functions described herein need not be separated in such a manner.

The RCG 302 generates a constant amount of current regardless of power supply line (VDD) variation. This reference current ("Iref") is used by the VBVGs to generate reference voltages pbias and nbias which determine the delay of the DEs. While the invention is not limited to a particular reference current generator, one of the current generators disclosed in the following references may be employed: U.S. Pat. No. 6,697,283 (Temperature and voltage compensated reference current generator); U.S. Pat. No. 6,686,795 (Compact self-biasing reference current generator); U.S. Pat. No. 5,557,194 (Reference current generator); and U.S. Pat. No. 4,684,880 (Reference current generator circuit); the disclosures of which are incorporated by reference herein.

The delay line 300 is controlled by two digital delay input controls ("Delay control input (LSB)" and "Delay line input (MSB)"), thus generating four delay steps total. The VBVG blocks (304-1 and 304-2) respectively generate different sets of bias voltages which are respectively set by the input delay controls. One set of pbias (positive bias) and nbias (negative bias) voltages are generated by VBVG 304-1 and serve to create a short delay (in accordance with DE 306-1). The other set of pbias and nbias voltages are generated by VBVG 304-2 and serve to create a long delay (in accordance with DEs 306-2 and 306-3). A "short" delay and a "long" delay are relative to each other, and can be set to whatever value is desired based on the application. In this illustrative embodiment, each DE produces a constant unit delay.

More specifically, the LSB (least significant bit) of the delay control ("Delay control input (LSB)") input to VBVG 304-1 generates bias voltages for DE 306-1, while the MSB (most significant bit) of the delay control ("Delay control input (MSB)") input to VBVG 304-2 generates bias voltages for DE 306-2 and 306-3. This creates a binary weighted delay structure which forms four delay steps (four different amounts of delay) using two input controls, i.e., a first delay step when the LSB and MSB are a logic one or high value, a second delay step when the LSB and MSB are a logic zero or low value, a third delay step when the LSB is a logic one and the MSB is a logic zero; and a fourth delay step when the LSB is a logic zero and the MSB is a logic one. Each step, based on programmable selection of the LSB and MSB, is realized at the output ("out") of delay line 300.

There are many important advantages in this delay architecture. First, by way of example, since the delay elements are controlled by bias voltages which are not directly in the delay signal path, there is no glitch at the output of the delay line when switching between different delay steps. Second, by way of further example, when the delay is set (delay input controls are set), a DE shows constant unit delay against any VDD variation. This is possible since the overall delay is set by RCG 302 which provides constant current regardless of VDD voltage variation. Thus, a DE according to principles of the invention will have an enhanced power supply insensitivity compared with the conventional delay elements.

Figure 4:
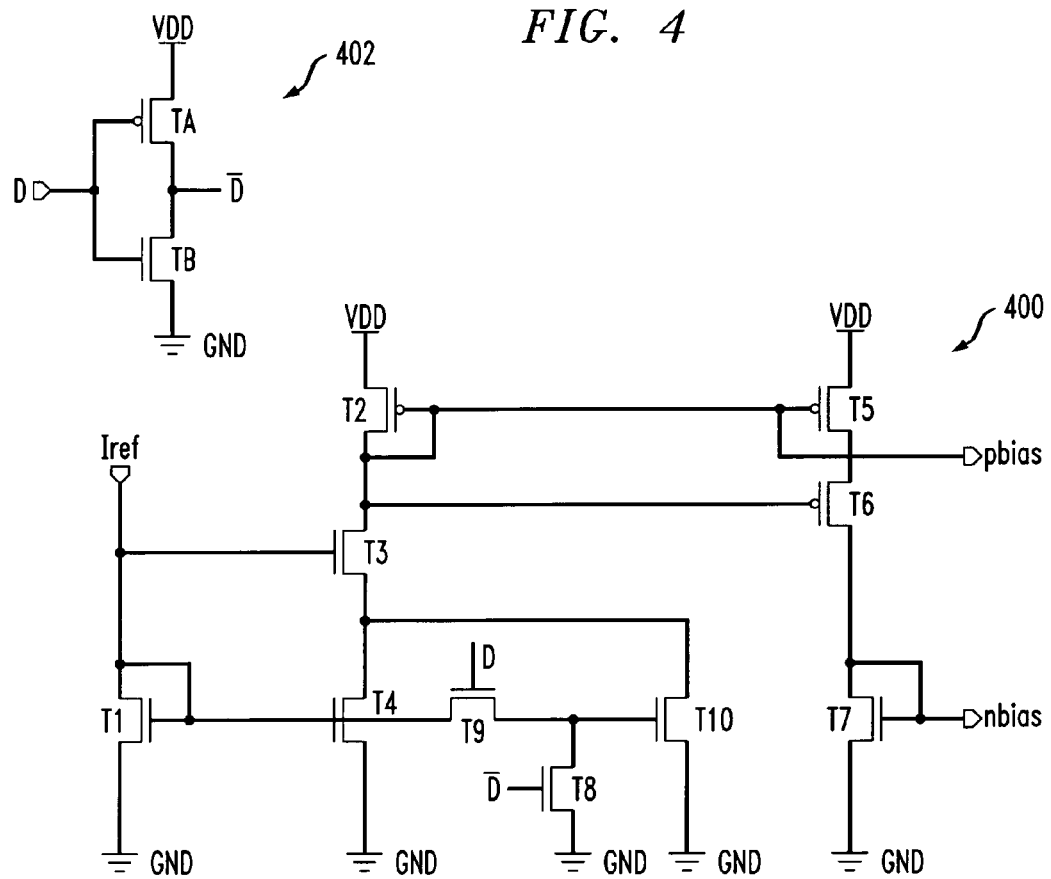
FIG. 4 illustrates a circuit diagram of a bias voltage generator, according to an embodiment of the present invention.

Referring now to FIG. 4, a bias voltage generator, according to an embodiment of the invention, is shown. It is to be understood that FIG. 4 shows an embodiment of one of the VBVGs (304-1 or 304-2) in FIG. 3. However, each VBVG is preferably implemented in this manner. Thus, bias voltage generator 300 is capable of generating two different sets of bias voltages for a DE according to the digital control input D (as shown in FIG. 3, "Delay control input (LSB)" or "Delay control input (MSB)").

A main function of circuit 400 is to form a constant voltage from VDD-to-pbias and nbias-to-GND. This is done by first mirroring the Iref input current to the second branch through FETs T1 and T4. To improve mirroring, a low VT (voltage threshold) transistor T3 is used. It is to be understood that a low VT FET is defined here as a FET which has a lower VT than normal VT FETs, which are used in the rest of the circuitry. This has the advantage of cascoding without the need for an additional bias voltage since the gate voltage of T3 and T4 is shared. This is possible with low VT transistors. T2 and T5 are formed as a conventional current mirror but low VT transistor T6 is added to form a cascoded output stage for better current matching. The gate voltages of T6 and T7 are the final output voltages pbias and nbias, respectively.

The digital input control signal D (and the complement of D, generated from D by the inverting stage 402 formed by FETs TA and TB) is used to control the amount of reference current mirrored to the final stage, thus generating two levels of pbias and nbias voltages. When D is high, T9 is on so the gate voltage of T4 and T10 are shorted. When D is low, T9 is off and T8 is on thus shorting the gate of T10 to GND. Since T4 and T10 have the same geometry, by digitally controlling D, the amount of reference current mirrored to the final branch can be Iref or Iref times two (Iref×2). When the amount of current is set to Iref, the generated pbias and nbias voltages form a long delay for a DE. When the amount of current is set to Iref×2, the DE will yield shorter delays.

Figure 5:
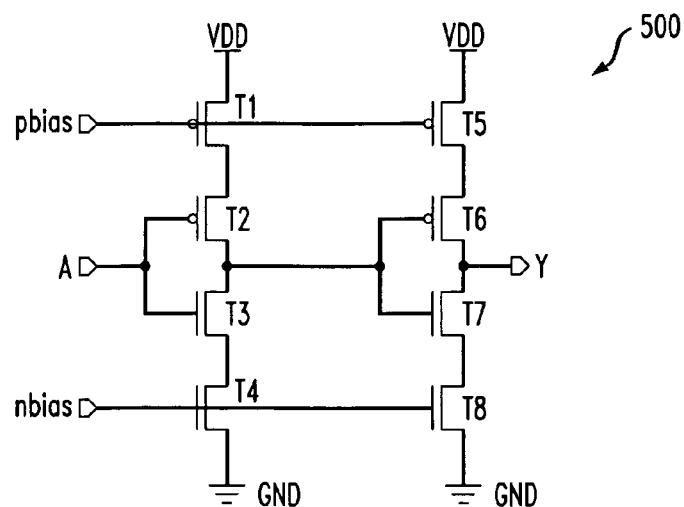
FIG. 5 illustrates a circuit diagram of a current limiting delay element, according to an embodiment of the present invention.

Referring now to FIG. 5, a current limiting delay element, according to an embodiment of the present invention, is shown. It is to be understood that FIG. 5 shows an embodiment of one of the DEs (306-1, 306-2 or 306-3) in FIG. 3. However, each DE is preferably implemented in this manner.

The current limiting delay element 500 of FIG. 5 has the characteristic of producing constant delay regardless of VDD variation. This is possible by limiting the current through the transistors using the pbias and nbias voltages produced by the VBVG block. Since the gate-to-source voltage of pFETs T1 and T5 is held constant by the pbias input voltage, the current through T1 and T5 is held constant against any VDD fluctuations. The same is true with respect to nFETs T4 and T8, where the gate voltage is provided by nbias input voltage. FETs T2, T3, T6 and T7 serve as the inverting stages, which delay input signal A from being output as output signal Y.

Advantageously, in at least one illustrative embodiment, principles of the invention provide circuitry for delaying a digital signal, comprising: a reference current generator (RCG) output node couple to a variable bias voltage generator (VBVG) input node. The bias voltage generator output node is couple to the bias input node of a delay element (DE). The VBVG is digitally controlled to generate delay steps instead of using conventional logic gate to vary the delay. Multiple DE blocks may be connected in a binary weighted manner to reduce the number of DE blocks used. The VBVG uses transistors T8 and T9 (FIG. 4) to control the amount of current mirrored to the final stage. The VBVG has low VT transistors which share the gate voltage with the mirroring transistors.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. Apparatus for delaying an input signal, comprising:
   a reference current generator for generating a constant current, wherein the constant current is insensitive to a variation of a power supply voltage;
   at least one variable bias voltage generator coupled to the reference current generator for generating a set of bias voltages based on the constant current generated by the reference current generator and a digitally programmable delay control input;
   at least one delay element coupled to the at least one variable bias voltage generator for delaying the input signal by a constant delay which is determined by the set of bias voltages generated by the at least one variable bias voltage generator;
   a second variable bias voltage generator coupled to the reference current generator for generating a second set of bias voltages based on the constant current generated by the reference current generator and a second digitally programmable delay control input; and
   a second delay element coupled to the second variable bias voltage generator and the at least one delay element for delaying the input signal by a second constant delay which is determined by the second set of bias voltages generated by the second variable bias voltage generator.

2. The apparatus of claim 1, further comprising a third delay element coupled to the second variable bias voltage generator and the second delay element for delaying the input signal by a third constant delay which is determined by the second set of bias voltages generated by the second variable bias voltage generator.

3. The apparatus of claim 2, wherein the at least one delay element, the second delay element, and the third delay element are coupled in a binary weighted manner so as to provide four delay steps using the two digitally programmable delay control inputs.

4. The apparatus of claim 1, wherein at least one of the one variable bias voltage generator and the second variable bias voltage generator comprises at least one current mirror, responsive to the digitally programmable control delay input, for controlling the amount of current used to generate the set of bias voltages.

5. The apparatus of claim 4, wherein at least one of the one variable bias voltage generator and the second variable bias voltage generator comprises at least one low voltage threshold transistor which shares a gate voltage with transistors comprising the at least one current mirror.

6. The apparatus of claim 1, wherein at least one of the one delay element and the second delay element comprises one or more transistors that are current limited based on the set of bias voltages generated by the at least one of the one variable bias voltage generator and the second variable bias voltage generator thereby causing the constant delay produced by the at least one of the one delay element and the second delay element to be insensitive to a variation of a power supply voltage.

7. A method for delaying an input signal, comprising:
generating a constant current, wherein the constant current is insensitive to a variation of a power supply voltage;
generating a set of bias voltages based on the constant current and a digitally programmable delay control input;
delaying the input signal by a constant delay determined by the set of bias voltages;
generating a second set of bias voltages based on the constant current and a second digitally programmable delay control input; and
delaying the input signal by a second constant delay which is determined by the second set of bias voltages.

8. A circuit for delaying an input signal, comprising:
a reference current generation circuit for generating a constant current, wherein the constant current is insensitive to a variation of a power supply voltage;
at least one variable bias voltage generation circuit coupled to the reference current generation circuit for generating a set of bias voltages based on the constant current generated by the reference current generation circuit and a digitally programmable delay control input;
at least one delay element circuit coupled to the at least one variable bias voltage generation circuit for delaying the input signal by a constant delay which is determined by the set of bias voltages generated by the at least one variable bias voltage generation circuit;
a second variable bias voltage generation circuit coupled to the reference current generation circuit for generating a second set of bias voltages based on the constant current generated by the reference current generation circuit and a second digitally programmable delay control input; and
a second delay element circuit coupled to the second variable bias voltage generation circuit and the at least one delay element circuit for delaying the input signal by a second constant delay which is determined by the second set of bias voltages generated by the second variable bias voltage generation circuit.

9. The circuit of claim 8, further comprising a third delay element circuit coupled to the second variable bias voltage generation circuit and the second delay element circuit for delaying the input signal by a third constant delay which is determined by the second set of bias voltages generated by the second variable bias voltage generation circuit.

10. The circuit of claim 9, wherein the at least one delay element circuit, the second delay element circuit, and the third delay element circuit are coupled in a binary weighted manner so as to provide four delay steps using the two digitally programmable delay control inputs.

11. The circuit of claim 8, wherein at least one of the one variable bias voltage generation circuit and the second variable bias voltage generation circuit comprises at least one current minor circuit, responsive to the digitally programmable control delay input, for controlling the amount of current used to generate the set of bias voltages.

12. The circuit of claim 11, wherein at least one of the one variable bias voltage generation circuit and the second variable bias voltage generation circuit comprises at least one low voltage threshold transistor which shares a gate voltage with transistors comprising the at least one current mirror circuit.

13. The circuit of claim 8, wherein at least one of the one delay element circuit and the second delay element circuit comprises one or more transistors that are current limited based on the set of bias voltages generated by the at least one of the one variable bias voltage generation circuit and the second variable bias voltage generation circuit thereby causing the constant delay produced by the at least one of the one delay element circuit and the second delay element circuit to be insensitive to a variation of a power supply voltage.

14. A programmable delay line for delaying an input signal, comprising:
a reference current generator for generating a constant current, wherein the constant current is insensitive to a variation of a power supply voltage;
a first variable bias voltage generator coupled to the reference current generator for generating a first set of bias voltages based on the constant current generated by the reference current generator and a digitally programmable delay control input;
a second variable bias voltage generator coupled to the reference current generator for generating a second set of bias voltages based on the constant current generated by the reference current generator and a second digitally programmable delay control input;
a first delay element coupled to the first variable bias voltage generator for delaying the input signal by a first constant delay which is determined by the first set of bias voltages generated by the first variable bias voltage generator;
a second delay element coupled to the second variable bias voltage generator and the first delay element for delaying the input signal by a second constant delay which is determined by the second set of bias voltages generated by the second variable bias voltage generator; and
a third delay element coupled to the second variable bias voltage generator and the second delay element for delaying the input signal by a third constant delay which is determined by the second set of bias voltages generated by the second variable bias voltage generator;
wherein the first delay element, the second delay element, and the third delay element are coupled in a binary weighted manner so as to provide four delay steps using the two digitally programmable delay control inputs.

* * * * *